US012801040B2

(12) United States Patent
Iwai et al.

(10) Patent No.: US 12,801,040 B2
(45) Date of Patent: Nov. 17, 2026

(54) DETECTION DEVICE, LITHOGRAPHY APPARATUS, AND ARTICLE MANUFACTURING METHOD

(71) Applicant: CANON KABUSHIKI KAISHA, Tokyo (JP)

(72) Inventors: Toshiki Iwai, Saitama (JP); Yuichi Fujita, Tochigi (JP); Shun Toda, Tochigi (JP); Yasuyuki Unno, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 642 days.

(21) Appl. No.: 18/350,067

(22) Filed: Jul. 11, 2023

(65) Prior Publication Data

US 2024/0027921 A1 Jan. 25, 2024

(30) Foreign Application Priority Data

Jul. 21, 2022 (JP) ................................ 2022-116574

(51) Int. Cl.
*G03F 9/00* (2006.01)

(52) U.S. Cl.
CPC .......... *G03F 9/7042* (2013.01); *G03F 9/7076* (2013.01); *G03F 9/7088* (2013.01)

(58) Field of Classification Search
CPC ............ G03F 7/70605; G03F 7/70616; G03F 7/70633; G03F 7/706849; G03F 7/706851; G03F 9/7042; G03F 9/7088; G03F 7/7076
See application file for complete search history.

(56) References Cited

U.S. PATENT DOCUMENTS

| | | | | |
|---|---|---|---|---|
| 7,292,326 | B2 | 11/2007 | Nimmakayala et al. | |
| 7,880,872 | B2 | 2/2011 | Nimmakayala et al. | |
| 2003/0053058 | A1* | 3/2003 | Tanaka .................. | G03F 9/7003 356/401 |
| 2006/0007436 | A1* | 1/2006 | Kurosawa .......... | G01N 21/9501 356/237.4 |

(Continued)

FOREIGN PATENT DOCUMENTS

| | | | |
|---|---|---|---|
| JP | 2008522412 | A | 6/2008 |
| TW | 1654422 | B | 3/2019 |

(Continued)

*Primary Examiner* — Steven H Whitesell
(74) *Attorney, Agent, or Firm* — ROSSI, KIMMS & McDOWELL LLP

(57) ABSTRACT

Detection device detects relative position between overlapping first and second marks. The device includes illumination system configured to illuminate the first and second marks with unpolarized illumination light, detection system having image sensor and configured to form image on imaging surface of the image sensor from diffracted lights from the first and second marks. The first and second marks are configured to form, on the imaging surface, optical information representing the relative position in first or second direction. Light blocking body arranged on pupil surface of the detection system includes first light blocking portion crossing the optical axis of the detection system in direction conjugate to the first direction and second light blocking portion crossing the optical axis of the detection system in fourth direction conjugate to the second direction.

17 Claims, 9 Drawing Sheets

(56) References Cited

U.S. PATENT DOCUMENTS

| | | | | |
|---|---|---|---|---|
| 2012/0328725 | A1* | 12/2012 | Minoda | B29D 11/00769 425/150 |
| 2013/0100459 | A1* | 4/2013 | Iwai | G01D 5/38 427/256 |
| 2019/0137893 | A1* | 5/2019 | Den Boef | G01N 21/211 |
| 2021/0318626 | A1* | 10/2021 | Taki | G03F 7/0002 |
| 2021/0333218 | A1* | 10/2021 | Feler | G03F 7/70633 |
| 2021/0364279 | A1* | 11/2021 | Manassen | G03F 7/706851 |
| 2021/0372776 | A1 | 12/2021 | Komaki et al. | |
| 2023/0064193 | A1* | 3/2023 | Tinnemans | G01N 21/4788 |
| 2024/0027926 | A1* | 1/2024 | Toda | G03F 9/7049 |

FOREIGN PATENT DOCUMENTS

| | | | |
|---|---|---|---|
| TW | 201916999 | A | 5/2019 |
| WO | 2007046820 | A2 | 4/2007 |

* cited by examiner

DETECTION DEVICE, LITHOGRAPHY APPARATUS, AND ARTICLE MANUFACTURING METHOD

BACKGROUND OF THE INVENTION

Field of the Invention

The present invention relates to a detection device, a lithography apparatus, and an article manufacturing method.

Description of the Related Art

An imprint apparatus brings a mold into contact with an imprint material arranged on a substrate, and cures the imprint material, thereby forming a pattern made of a cured product of the imprint material. In this imprint apparatus, it is important to correctly align the substrate and the mold. Japanese Patent Laid-Open No. 2008-522412 describes a technique of aligning a substrate and a mold using a mark formed by a diffraction grating provided on the substrate and a mark formed by a diffraction grating provided on the mold.

If the mark is illuminated, light reflected by an edge as the boundary between the mark and a region outside the mark enters an image sensor as noise light, and this may decrease the detection accuracy of the mark. Especially, if the area of the mark is reduced, the influence of the noise light on an image formed by light for detecting position information from the mark becomes large, and thus the decrease in detection accuracy may be conspicuous.

SUMMARY OF THE INVENTION

The present invention provides a technique advantageous in detecting the relative position between the first mark and the second mark provided on the first object and second object, respectively, with high detection accuracy.

One of aspects of the present invention provides a detection device for detecting a relative position between a first mark and a second mark respectively provided in a first object and a second object arranged to overlap each other, comprising: an illumination system configured to illuminate the first mark and the second mark with illumination light which is unpolarized light; and a detection system including an image sensor and configured to form an image on an imaging surface of the image sensor from diffracted lights from the first mark and the second mark illuminated by the illumination system, wherein the first mark and the second mark are configured to form, on the imaging surface, optical information representing the relative position in a first direction or a second direction orthogonal to the first direction, a light blocking body including a first light blocking portion crossing an optical axis of the detection system in a direction parallel to a third direction and a second light blocking portion crossing the optical axis of the detection system in a direction parallel to a fourth direction is provided on a pupil surface of the detection system, and the third direction is a direction conjugate to the first direction and the fourth direction is a direction conjugate to the second direction.

DESCRIPTION OF THE EMBODIMENTS

Figure 1B:
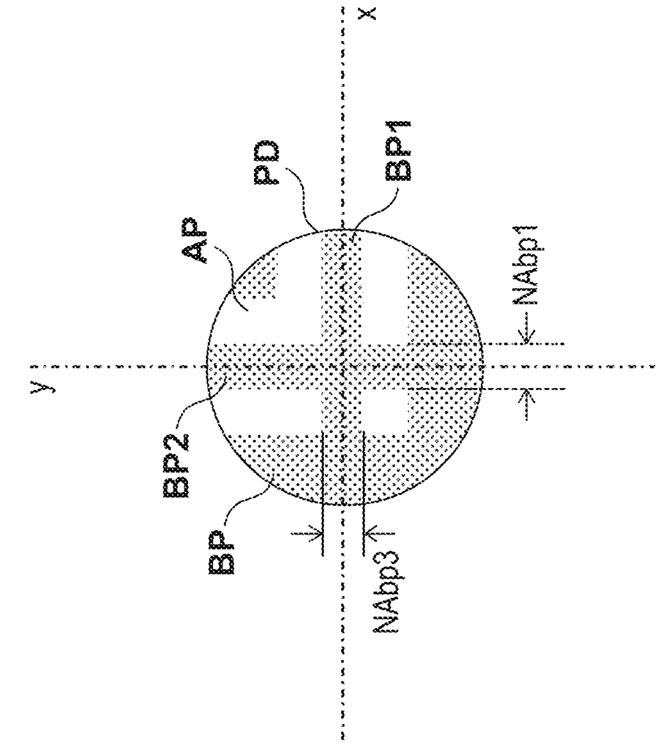
FIG. 1B is a view showing a light blocking body arranged on the pupil surface of the detection system according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

Figure 2:
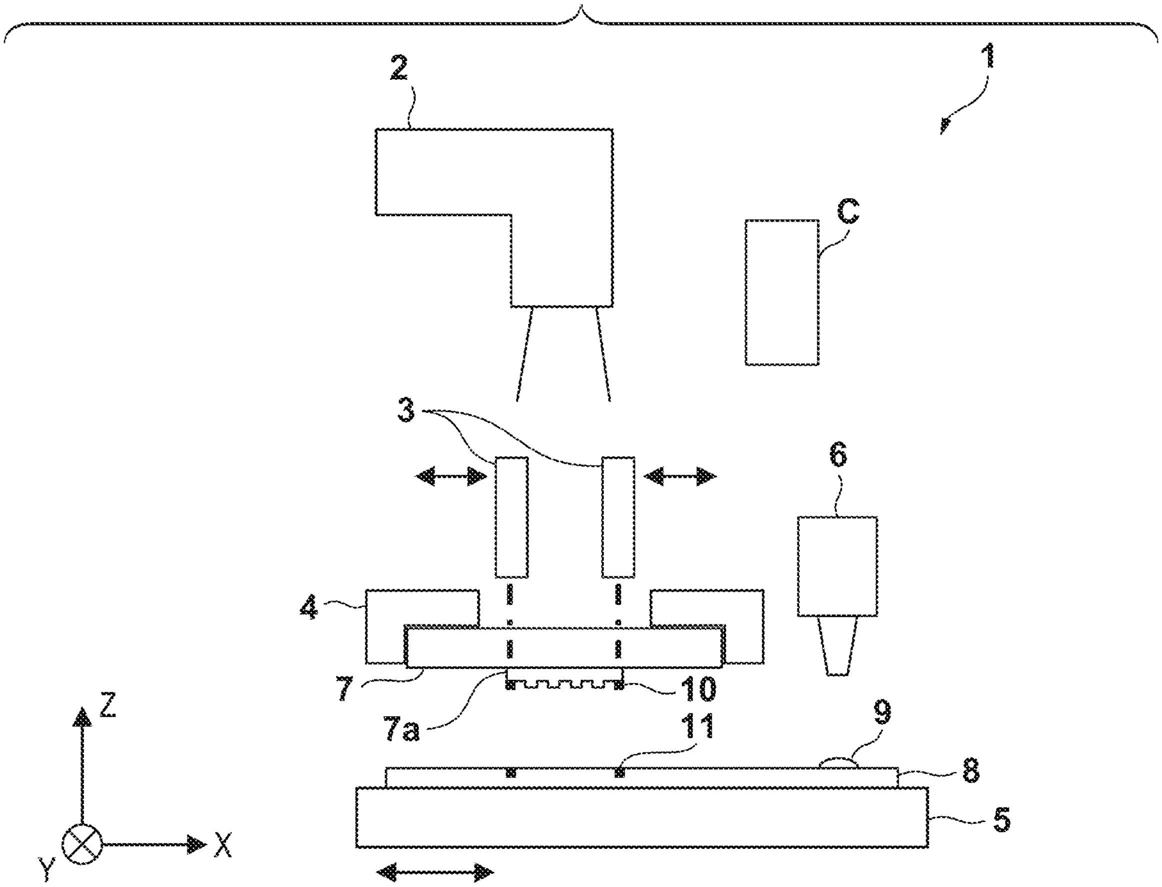
FIG. 2 is a view exemplifying the arrangement of an imprint apparatus as an example of a lithography apparatus.

FIG. 2 shows the arrangement of an imprint apparatus 1 as an example of a lithography apparatus that transfers a pattern of an original to a substrate. The imprint apparatus 1 is used to manufacture a device such as a semiconductor device, and forms a pattern made of a cured product of an imprint material 9 on a substrate 8 by molding the uncured imprint material 9 on the substrate 8 as a processing target object using a mold 7. A pattern forming process of forming a pattern on the substrate 8 by the imprint apparatus 1 can include a contact step, a filling and alignment step, a curing step, and a separation step. In the contact step, the imprint material 9 on a shot region of the substrate 8 and a pattern region 7*a* of the mold 7 are brought into contact with each other. In the filling and alignment step, a space defined by the substrate 8 and the pattern region 7*a* is filled with the imprint material 9, and the shot region of the substrate 8 and the pattern region 7*a* of the mold 7 are aligned. The shot region is a region where the pattern is formed by one pattern forming process. In other words, the shot region is a region where the pattern region 7*a* of the mold 7 is transferred by one pattern forming process.

As the imprint material, a curable composition (to be also referred to as a resin in an uncured state) to be cured by receiving curing energy is used. As the curing energy, an electromagnetic wave or heat can be used. The electromagnetic wave can be, for example, light selected from the wavelength range of 10 nm (inclusive) to 1 mm (inclusive), for example, infrared light, a visible light beam, or ultraviolet light. The curable composition can be a composition cured by light irradiation or heating. Among compositions, a photo-curable composition cured by light irradiation contains at least a polymerizable compound and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The imprint material can be arranged on the substrate in the form of droplets or in the form of an island or film formed by connecting a plurality of droplets. The imprint material may be supplied onto the substrate in the form of a film by a spin coater or a slit coater. The viscosity (the viscosity at 25° C.) of the imprint material can be, for example, 1 mPa·s (inclusive) to 100 mPa·s (inclusive). As the material of the substrate, for example, glass, a ceramic, a metal, a semiconductor (Si, GaN, SiC, or the like), a resin, or the like can be used. A member made of a material different from the substrate may be provided on the surface of the substrate, as needed. The substrate is, for example, a silicon wafer, a compound semiconductor wafer, or silica glass. An example of adopting a photo-curable composition as the imprint material will be described below but this is not intended to limit the type of the imprint material.

In the specification and the accompanying drawings, directions will be indicated on an XYZ coordinate system in which directions parallel to the surface of the substrate 8 are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes. Positioning means controlling the position and/or orientation. Alignment (positioning) can include controlling the position and/or orientation of at least one of the substrate 8 and the mold 7 such that the alignment error (overlay error) between the shot region of the substrate 8 and the pattern region of the mold 7 decreases. In addition, alignment can include control to correct or change the shape of at least one of the shot region of the substrate 8 and the pattern region of the mold 7. The contact step and the separation step can be executed by driving the mold 7 by a mold driving mechanism 4, but may be executed by driving the substrate 8 by a substrate driving mechanism 5. Alternatively, the contact step and the separation step may be executed by driving the mold 7 by the mold driving mechanism 4 and driving the substrate 8 by the substrate driving mechanism 5.

The imprint apparatus 1 can include a curing unit 2, a detection device 3, the mold driving mechanism 4, the substrate driving mechanism 5, and a control unit C. The imprint apparatus 1 may further include an application unit 6. After the contact step of bringing the mold 7 into contact with the imprint material 9 on the substrate 8, the curing unit 2 irradiates the imprint material 9 with light such as ultraviolet light as curing energy, thereby curing the imprint material 9. The curing unit 2 includes, for example, a light source, and a plurality of optical elements for uniformly irradiating the pattern region 7*a* of the mold 7 as an irradiated surface with light emitted from the light source in a predetermined shape. In particular, the irradiation region (irradiation range) with light by the curing unit 2 desirably has a surface area almost equal to the surface area of the pattern region 7*a* or slightly larger than the area of the pattern region 7*a*. This is to prevent, by making the irradiation region have a minimum necessary area, a situation in which the mold 7 or the substrate 8 expands due to heat generated by irradiation to cause a positional shift or distortion of the pattern transferred to the imprint material 9. In addition, this is to prevent a situation in which light reflected by the substrate 8 or the like reaches the application unit 6 to cure the imprint material 9 remaining in the discharge portion of the application unit 6, and an abnormality thus occurs in the operation of the application unit 6. As the light source, for example, a high-pressure mercury lamp, various kinds of excimer lamps, an excimer laser, or a light-emitting diode can be adopted. The light source can appropriately be selected in accordance with the characteristic of the imprint material 9 as a light receiving object.

Figure 3:
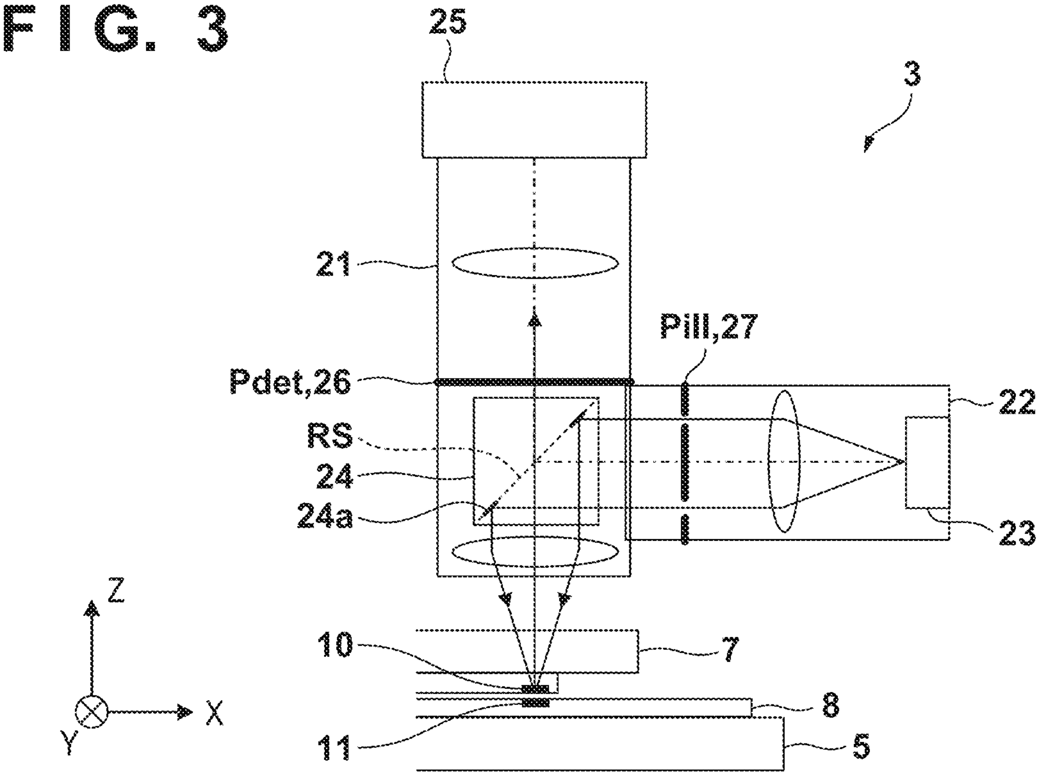
FIG. 3 is a view exemplifying the arrangement of a detection device according to the first embodiment.

FIG. 3 shows an example of the arrangement of the detection device 3. The detection device 3 is configured to optically detect or measure the relative position between a mold mark (first mark) 10 arranged on the mold (first object) 7 and a substrate mark (second mark) 11 arranged on the substrate (second object) 8. The mold mark 10 and the substrate mark 11 are configured to form optical information representing the relative position in the X direction (first direction) or the Y direction (second direction) on the imaging surface of an image sensor 25 (to be described later). The detection device 3 can include an illumination system 22 and a detection system 21. The illumination system 22 and the detection system 21 can share some components. The illumination system 22 includes a light source 23, and generates illumination light using light from the light source 23 and illuminates measurement target objects (first mark and second mark) with the illumination light. This illumination light can be unpolarized light. It is possible to form, on the imaging surface, an optical image with higher luminance using unpolarized light as illumination light than using polarized light. The detection system 21 detects the relative position between the mold mark (first mark) 10 and the substrate mark (second mark) 11, as a measurement target object, by detecting lights from the measurement target objects illuminated with the illumination light.

Among the optical axes of the detection device 3, an optical axis at the positions of the substrate 8 and the mold 7 is vertical to the upper surface of the substrate 8 and the lower surface (pattern region 7*a*) of the mold 7, that is, parallel to the Z-axis. The detection device 3 can be configured to be driven in the X direction and the Y direction by a driving mechanism (not shown) in accordance with the positions of the mold mark 10 and the substrate mark 11. The detection device 3 may be configured to be driven in the Z direction to align the focus of the detection system 21 with the position of the mold mark 10 or the substrate mark 11. The detection device 3 may include an optical element or optical system for focus alignment. Based on the relative position between the mold mark 10 and the substrate mark 11 detected or measured using the detection device 3, positioning of the substrate 8 by the substrate driving mechanism 5 and correction of the shape and magnification of the pattern region 7*a* by a correction mechanism (not shown) can be controlled. The correction mechanism is mounted on the mold driving mechanism 4, and can adjust the shape and magnification of the pattern region 7*a* of the mold 7 by deforming the mold 7. The mold mark 10 and the substrate mark 11 will be described in detail later.

The mold driving mechanism 4 can include a mold chuck (not shown) that holds the mold 7 by a vacuum suction force or an electrostatic force, and a mold driving unit (not shown) that drives the mold 7 by driving the mold chuck. The mold driving mechanism 4 can include the above-described correction mechanism. For example, the mold driving unit can be configured to drive the mold chuck or the mold 7 with respect to the Z-axis. The mold driving unit may be configured to further drive the mold chuck or the mold 7 with respect to at least one of the θX-axis, the θY-axis, the θZ-axis, the X-axis, and the Y-axis.

The substrate driving mechanism 5 can include a substrate chuck that holds the substrate 8 by a vacuum suction force or an electrostatic force, and a substrate driving unit (not shown) that drives the substrate 8 by driving the substrate chuck. For example, the substrate driving unit can be configured to drive the substrate chuck or the substrate 8 with respect to the X-axis, the Y-axis, and the θZ-axis. The substrate driving unit may be configured to further drive the substrate chuck or the substrate 8 with respect to at least one of the θX-axis, the θY-axis, and the Z-axis.

The application unit (dispenser) 6 applies or arranges the uncured imprint material 9 on the substrate 8. The application unit 6 may be arranged outside the housing of the imprint apparatus 1. In this case, the application unit 6 may be understood as a component that is not a component of the imprint apparatus 1.

The mold 7 includes, in the pattern region 7*a*, a pattern such as a circuit pattern to be transferred to the substrate 8 (the imprint material 9 thereon). The mold 7 can be made of a material that transmits light as curing energy, for example, quartz. The substrate 8 can be, for example, a semiconductor substrate such as a single-crystal silicon substrate or a substrate including at least one layer on a semiconductor substrate.

The control unit C can be configured to control the curing unit 2, the detection device 3, the mold driving mechanism 4, the substrate driving mechanism 5, and the application unit 6. The control unit C can be formed by, for example, a Field Programmable Gate Array (FPGA), a computer embedded with a program, or a combination of all or some of these components. The FPGA can include a Programmable Logic Device (PLD) or an Application Specific Integrated Circuit (ASIC). The control unit C includes a memory and a processor, and can define the operation and function of the imprint apparatus 1 by operating based on arithmetic formulas, parameters, and computer programs stored (saved) in the memory. At least part of the function of the detection device 3, for example, a function of processing an image captured by the image sensor 25 may be provided by a module incorporated in the control unit C. In this case, the module of the control unit C can be understood as part of the detection device 3.

An imprint process or pattern forming process executed by the imprint apparatus 1 will now be described. First, the substrate 8 is conveyed to the substrate chuck of the substrate driving mechanism 5 by a substrate conveyance mechanism (not shown), and fixed to the substrate chuck. Subsequently, the substrate 8 is driven by the substrate driving mechanism 5 so that the shot region of the substrate 8 moves to an application position by the application unit 6. After that, the application unit 6 applies, arranges, or supplies the imprint material 9 onto the shot region (imprint region) of the substrate (application step).

Next, the substrate 8 is driven by the substrate driving mechanism 5 so that the shot region where the imprint material 9 has been arranged is arranged at a position immediately below the pattern region 7*a* of the mold 7. Then, for example, the mold driving mechanism 4 lowers the mold 7 to bring the imprint material 9 on the substrate 8 and the pattern region 7*a* of the mold 7 into contact with each other (contact step). This fills the space (including a concave portion of the pattern region 7*a*) between the substrate 8 and the pattern region 7*a* of the mold 7 with the imprint material 9 (filling step). Furthermore, with respect to a plurality of mark pairs each formed by the mold mark 10 and the substrate mark 11, the detection device 3 is used to detect or measure the relative position between the mold mark 10 and the substrate mark 11. Based on the result, the pattern region 7*a* and the shot region of the substrate 8 are aligned (alignment step). At this time, the correction mechanism may be used to correct the shape of the pattern region 7*a* of the mold 7. In addition, a heating mechanism (not shown) may be used to correct the shape of the shot region of the substrate 8.

Upon completion of the filling and alignment steps, the curing unit 2 irradiates the imprint material 9 with light via the mold 7, thereby curing the imprint material 9 (curing step). At this time, the detection device 3 can be driven to retreat so as not to block the optical path of the curing unit 2. Subsequently, the mold driving mechanism 4 raises the mold 7 to separate the mold 7 from the cured imprint material 9 on the substrate 8 (separation step).

The imprint apparatus 1 can be understood as an example of a lithography apparatus that includes the detection device 3, aligns the original (or the pattern region) and the substrate (or the shot region) based on an output from the detection device 3, and transfers the pattern of the original to the substrate. The imprint apparatus 1 aligns the mold 7 (first object or original) provided with the mold mark 10 (first mark) and the substrate 8 (second object) provided with the substrate mark 11 (second mark) based on an output from the detection device 3.

Details of the detection device 3 will be described below with reference to FIG. 3. As described above, the detection device 3 includes the illumination system 22 and the detection system 21, and the illumination system 22 and the detection system 21 can share some components. The illumination system 22 guides illumination light generated by light from the light source 23 to a common optical axis via a prism 24, thereby illuminating the mold mark 10 and the substrate mark 11. The light source 23 can include, for example, at least one of a halogen lamp, an LED, a semiconductor laser (LD), a high-pressure mercury lamp, a metal halide lamp, a supercontinuum light source, and a Laser-Driven Light Source (LDLS). The wavelength of the illumination light generated by the light source 23 is selected not to cure the imprint material 9.

The prism 24 is shared by the illumination system 22 and the detection system 21, and can be arranged on or near a pupil surface Pill of the illumination system 22 or on or near a pupil surface Pdet of the detection system 21. Each of the mold mark 10 and the substrate mark 11 can include a mark formed by a diffraction grating. The detection system 21 can form, on the imaging surface of the image sensor 25, an optical image of interference light (an interference fringe or moiré fringe) generated by interference between lights diffracted by the mold mark 10 and the substrate mark 11 which are illuminated by the illumination system 22. The image sensor 25 can be formed by, for example, a CCD sensor or a CMOS sensor.

The prism 24 can include, as a reflective surface RS, a surface (bonding surface) obtained by bonding two members, and include a reflective film 24*a* on the bonding surface. The prism 24 may be replaced by a plate-shaped optical element having the reflective film 24*a* on its surface. A position at which the prism 24 is arranged need not be on or near the pupil surface Pill of the illumination system 22, or on or near the pupil surface Pdet of the detection system 21. An illumination aperture stop 27 can be arranged on the pupil surface Pill of the illumination system 22. A detection aperture stop 26 can be arranged on the pupil surface Pdet of the detection system 21. The illumination aperture stop 27 defines the light intensity distribution of the pupil surface Pill of the illumination system 22. Note that the illumination aperture stop 27 may be an arbitrary component, and illumination light parallel to the optical axis may be formed by defining the region of the reflective film 24*a*.

Figure 4:
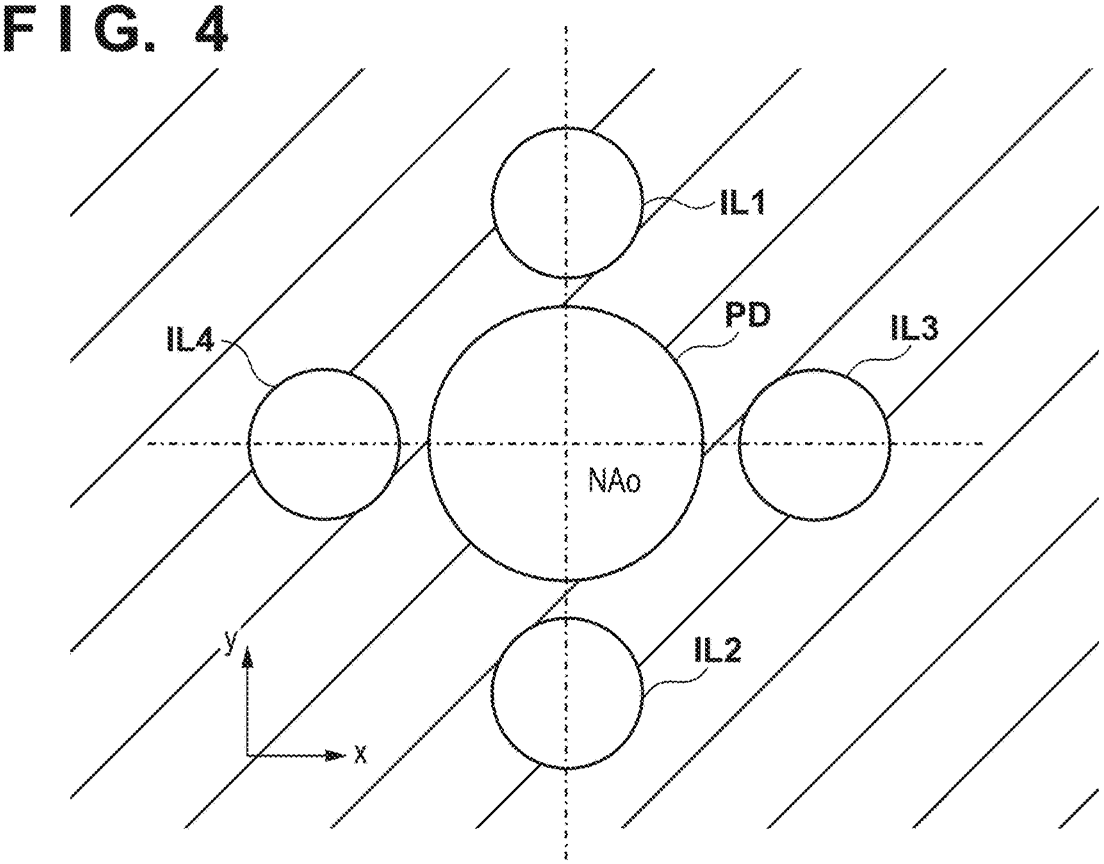
FIG. 4 is a view showing a comparative example.

FIG. 4 shows the light intensity distribution of the pupil surface Pill of the illumination system 22 of the detection device 3 and the detection aperture stop that defines a numerical aperture $NA_O$ of the detection system 21 by superimposing them on each other according to a comparative example. The x-axis and the y-axis are axes conjugate to the X-axis and the Y-axis, respectively. In a case where there is no mirror that bends the optical axis between the pupil surface and the mold/substrate, the x-axis and the X-axis are parallel to each other. In a case where there is a mirror that bends the optical axis between the pupil surface and the mold/substrate, the X-axis and the Y-axis mapped on the pupil surface by the mirror coincide with the x-axis and the y-axis, respectively. The light intensity distribution of the pupil surface Pill of the illumination system 22 includes a first pole IL1, a second pole IL2, a third pole IL3, and a fourth pole IL4. Illumination by the light intensity distribution including the poles IL1 to IL4 can be understood as oblique incident illumination. Lights from the illuminated marks 10 and 11 enter the imaging surface of the image sensor 25 via the opening of the aperture stop that defines the numerical aperture $NA_O$ of the detection system 21.

FIGS. 5A to 5D are views each showing an example of a mark (diffraction grating) that generates a moiré fringe. The principle of generating a moiré fringe by diffracted lights from the mold mark 10 and the substrate mark 11 and detection of the relative position between the mold mark 10 and the substrate mark 11 using the moiré fringe will be described below with reference to FIGS. 5A to 5D. The periods in the measurement direction of a diffraction grating (first diffraction grating) 41 provided as the mold mark 10 in the mold 7 and a diffraction grating (second diffraction grating) 42 provided as the substrate mark 11 in the substrate 8 are slightly different from each other. If two diffraction gratings having different periods are superimposed on each other, a pattern having a period reflecting the difference in period between the diffraction gratings, that is, a so-called moiré fringe (moiré) appears due to interference between diffracted lights from the two diffraction gratings. At this time, since the phase of the moiré fringe changes in accordance with the relative position between the diffraction gratings, it is possible to obtain the relative position between the mold mark 10 and the substrate mark 11, that is, the relative position between the mold 7 and the substrate 8 by detecting the moiré fringe.

Figure 5A:
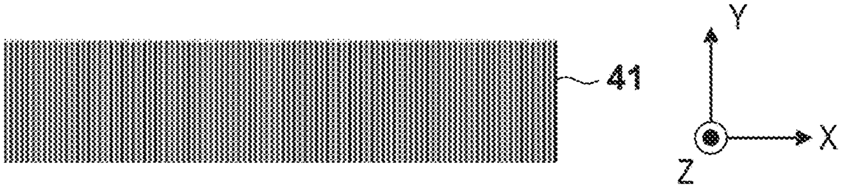
FIGS. 5A to 5D are views exemplifying diffraction gratings that generate a moiré fringe.
Figure 5B:
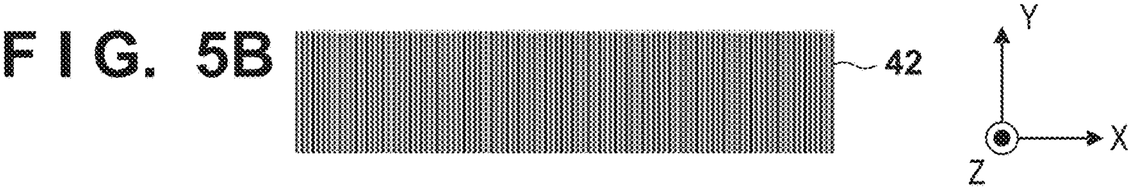
Figure 5C:
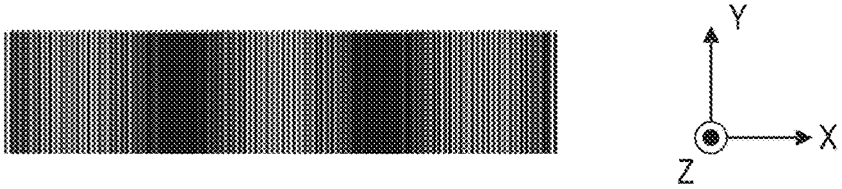
Figure 5D:
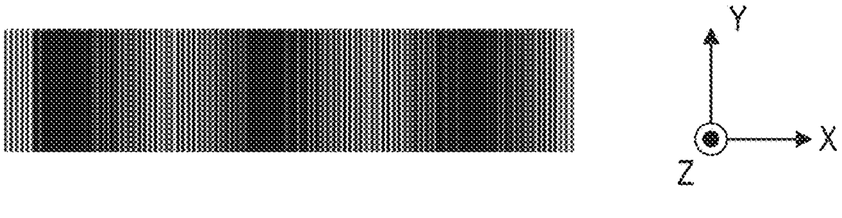

More specifically, if the diffraction gratings 41 and 42 having the slightly different periods are superimposed on each other, the diffracted lights from the diffraction gratings 41 and 42 overlap each other, thereby generating a moiré fringe having a period reflecting the difference in period, as shown in FIG. 5C. In the moiré fringe, the positions of bright and dark portions (the phase of the fringe) change in accordance with the relative position between the diffraction gratings 41 and 42. If, for example, one of the diffraction gratings 41 and 42 is shifted in the X direction, the moiré fringe shown in FIG. 5C changes to a moiré fringe shown in FIG. 5D. Since the moiré fringe is generated as a fringe having a large period by enlarging the actual positional shift amount between the diffraction gratings 41 and 42, even if the resolution of the detection system 21 is low, it is possible to detect the relative position between the diffraction gratings 41 and 42 with high accuracy.

In the comparative example, in a case where the diffraction gratings 41 and 42 are detected in a bright field to detect a moiré fringe, the detection system 21 unwantedly detects zero-order lights from the diffraction gratings 41 and 42. A case where the diffraction gratings 41 and 42 are detected in a bright field can include a case where the diffraction gratings 41 and 42 are illuminated from the vertical direction and lights diffracted in the vertical direction by the diffraction gratings 41 and 42 are detected. Since the zero-order lights decrease the contrast of the moiré fringe, in the comparative example, the detection system 21 has an arrangement (an arrangement of a dark field) for detecting no zero-order lights, that is, an arrangement for illuminating the diffraction gratings 41 and 42 with oblique incidence.

FIGS. 6A to 6D are views showing other examples of marks (diffraction gratings) that generate a moiré fringe. In the examples shown in FIGS. 6A to 6D, one of the diffraction gratings 41 and 42 is a checkerboard diffraction grating shown in FIG. 6A, and the other diffraction grating is a diffraction grating shown in FIG. 6B. The diffraction grating shown in FIG. 6B includes a pattern periodically arrayed in the measurement direction (first direction) and a pattern periodically arrayed in a direction (second direction) orthogonal to the measurement direction.

Figure 6A:
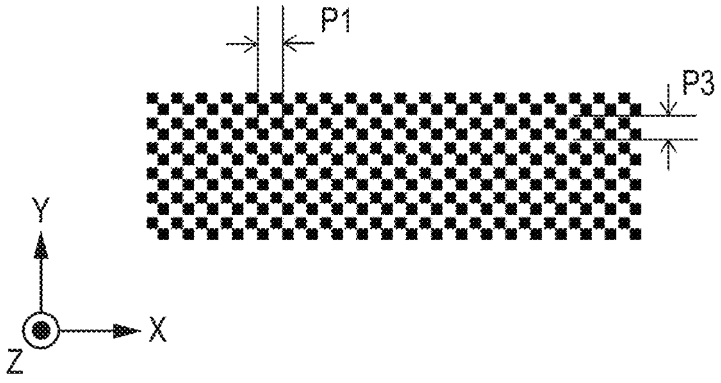
FIGS. 6A to 6D are views exemplifying diffraction gratings that generate a moiré fringe.
Figure 6B:
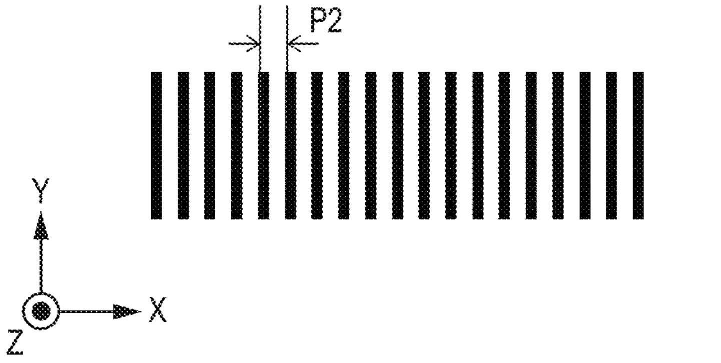

In the arrangement shown in FIG. 4 (comparative example) and FIGS. 6A and 6B, lights from the first pole IL1 and the second pole IL2 irradiate the diffraction gratings, and are diffracted in the Y direction and the X direction by the checkerboard diffraction grating. Furthermore, lights diffracted in the X direction by the diffraction gratings having slightly different periods have X-direction relative position information, pass through the detection region ($NA_O$) on the pupil surface Pdet of the detection system 21 to enter the imaging surface of the image sensor 25, and are detected by the image sensor 25. This can be used to obtain the relative position between the two diffraction gratings 41 and 42.

Figure 6C:
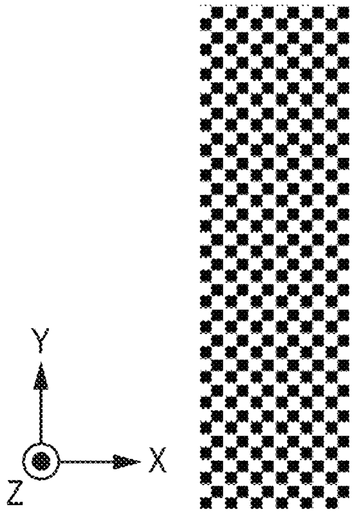
Figure 6D:
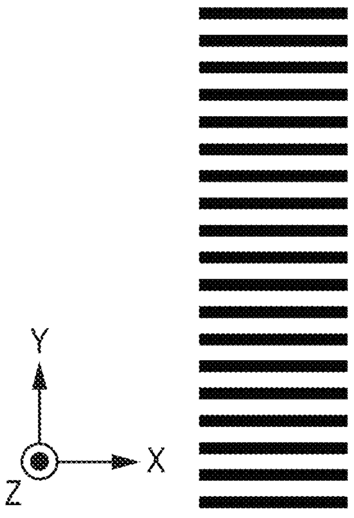

In a combination of the arrangement of FIG. 4 (comparative example) and the diffraction gratings shown in FIGS. 6A and 6B, lights from the third pole IL3 and the fourth pole IL4 are not used to detect the relative position between the diffraction gratings. On the other hand, in a case where the relative position between diffraction gratings shown in FIGS. 6C and 6D is detected, lights from the third pole IL3 and the fourth pole IL4 are used to detect the relative position between the diffraction gratings and lights from the first pole IL1 and the second pole IL2 are not used to detect the relative position between the diffraction gratings. Furthermore, in a case where the pair of the diffraction gratings shown in FIGS. 6A and 6B and the pair of the diffraction gratings shown in FIGS. 6C and 6D are arranged in the same field of view of the detection system 21 to detect the relative positions in the two directions at the same time, the pupil intensity distribution shown in FIG. 4 is useful.

Figure 7:
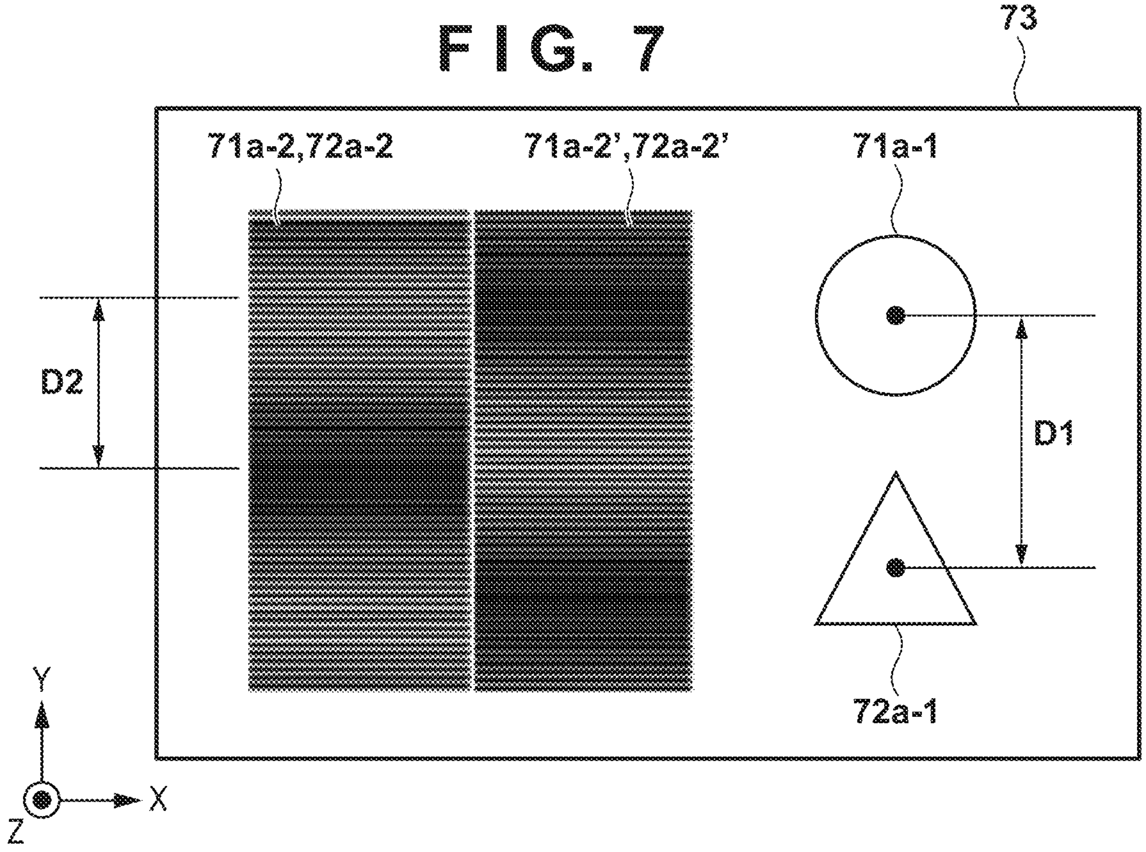
FIG. 7 is a view exemplifying a mark arrangement in the field of view.

Marks observed in one field of view will now be described in detail. FIG. 7 is a view schematically showing an image detected by the image sensor 25 when superimposing the mold 7 and the substrate 8 on each other. A range 73 of an outer frame indicates a range that can be observed by the detection device 3 at once. The above-described mold mark 10 includes a rough-detection mark 71*a*-1 and diffraction gratings 71*a*-2 and 71*a*-2' as fine-detection marks, and the above-described substrate mark 11 includes a rough-detection mark 72*a*-1 and diffraction gratings 72*a*-2 and 72*a*-2' as fine-detection marks. It is possible to obtain the relative positional shift between the mold 7 and the substrate 8 from the detection result of the detection device 3 with reference to the geometrical center positions of the rough-detection marks 71*a*-1 and 72*a*-1. The difference between a measurement value D1 and a design value for the rough-detection marks 71*a*-1 and 72*a*-1 is the relative positional shift. These marks allow rough alignment.

Next, a moiré fringe that is formed when the diffraction gratings 71*a*-2 and 72*a*-2 overlap each other will be described. The diffraction gratings 71*a*-2 and 72*a*-2 are each formed by a periodic pattern shown in FIG. 6C or 6D, and have slightly different periods in the measurement direction. Thus, if these diffraction gratings are superimposed on each other, a moiré fringe whose light intensity changes in the Y direction is formed. Because of the difference in period between the diffraction gratings 71*a*-2 and 72*a*-2, the shift direction of the moiré fringe when the relative position changes is different. For example, in a case where the period of the diffraction grating 71*a*-2 is slightly larger than the period of the diffraction grating 72*a*-2, if the substrate 8 relatively shifts in the +Y direction, the moiré fringe also shifts in the +Y direction. On the other hand, in a case where the period of the diffraction grating 71*a*-2 is slightly smaller than the period of the diffraction grating 72*a*-2, if the substrate 8 relatively shifts in the +Y direction, the moiré fringe shifts in the −Y direction.

The diffraction gratings 71*a*-2' and 72*a*-2' form another moiré fringe. The magnitude relationship between the periods of the diffraction gratings 71*a*-2 and 72*a*-2 is reversed with respect to the magnitude relationship between the periods of the diffraction gratings 71*a*-2' and 72*a*-2'. Therefore, if the relative position changes, the positions of the two measured moiré fringes change in the opposite directions. If the periodic marks on the mold side and the substrate side, that generate moiré fringes, are shifted by one period, it is impossible to detect the shift for one period in the moiré fringe detection principle. Therefore, by using the rough-detection marks 71*a*-1 and 72*a*-1, it can be confirmed that there is no relative positional shift for one period between the mold 7 and the substrate 8. The rough-detection marks 71*a*-1 and 72*a*-1 may be marks that generate a moiré signal as long as the diffraction grating of the mold 7 and the diffraction grating of the substrate 8 have pitches that generate no positional error for one period.

Since the constituent materials of the rough-detection mark 71*a*-1 of the mold 7 and the rough-detection mark 72*a*-1 of the substrate 8 may be different from each other, the light intensity detected by the image sensor 25 may vary depending on the wavelength. Thus, the illumination system 22 is preferably configured to be able to change the wavelength of the illumination light. This can be implemented by forming the light source 23 to generate light having a corresponding wavelength range and providing a filter that selectively transmits light of an arbitrary wavelength within the wavelength range. Alternatively, a plurality of light sources that generate lights of different wavelengths may be provided and a light source selected from them may be made to emit light. By making it possible to change the wavelength of the illumination light, the ratio between the light intensity of an image of the rough-detection mark 71*a*-1 and the light intensity of an image of the rough-detection mark 72*a*-1 can be adjusted. When the wavelength of the illumination light is changeable, this is effective to adjust the light intensity of the moiré fringe formed by the diffraction gratings 71*a*-2, 71*a*-2', 72*a*-2, and 72*a*-2'.

When the mold mark 10 and the substrate mark 11 are irradiated with the illumination light, the illumination light can be scattered by the edge (to be referred to as the pattern edge hereinafter) of each of the diffraction gratings 71*a*-2, 71*a*-2', 72*a*-2, and 72*a*-2'. For example, with respect to the diffraction grating 71*a*-2, the pattern edge is the boundary between the overall diffraction grating 71*a*-2 and a portion outside the diffraction grating 71*a*-2. If, due to factors such as the step amounts and/or constituent materials of the diffraction gratings 71*a*-2, 71*a*-2', 72*a*-2, and 72*a*-2', the signal strength of the moiré fringe is weak, an error may occur in the detection result due to scattered light. Therefore, it is desired to decrease the influence of the scattered light at the pattern edge (that is, entry of the scattered light to the image sensor 25).

Figure 8:
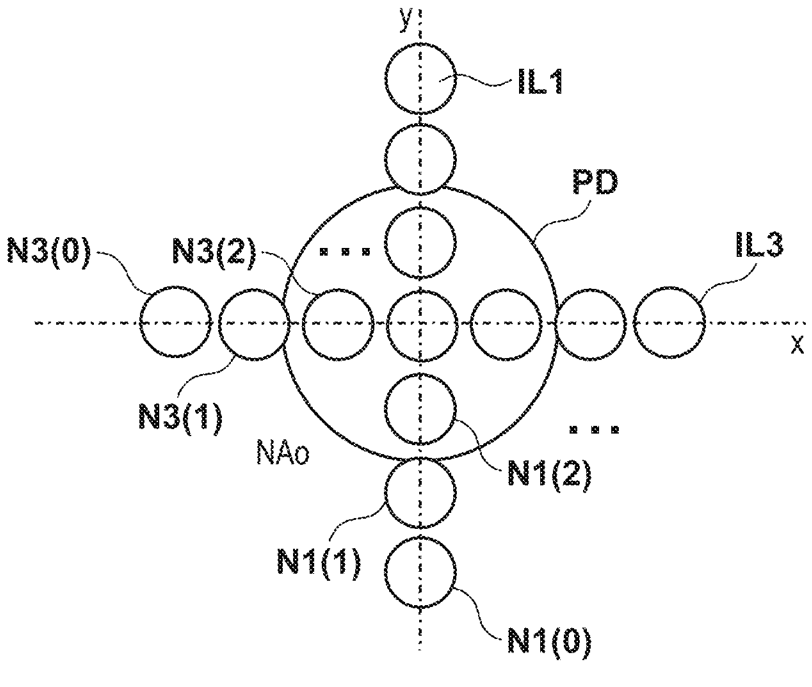
FIG. 8 is a view exemplifying scattered lights by pattern edges.

FIG. 8 shows the light intensity distribution of light entering the pupil surface Pdet of the detection system 21 and the light intensity distribution at the exit of the pupil surface Pill of the illumination system 22 by superimposing them on each other according to a comparative example. Note that FIGS. 5A to 5D show the poles IL1 to IL4 but FIG. 8 shows only the poles IL1 and IL3 for the sake of simplicity. Lights scattered by the pattern edges are also generated by the poles IL2 and IL4. Scattered light that can be generated by illumination with the illumination light from the pole IL1 in FIG. 8 will be described. The mold mark 10 and the substrate mark 11 are irradiated with the illumination light from the pole IL1. Since thus generated specular reflected lights are emitted outside an opening PD of the detection aperture stop 26 of the detection system 21, they are blocked by the detection aperture stop 26. Such specular reflected lights are not detected by the image sensor 25. The illumination light emitted to the pattern edge parallel to the X direction is scattered in the Y direction by the pattern edge to generate first-order reflected light N1(1) and second-order reflected light N1(2) with reference to specular reflected light N1(0) of the illumination light from the pole IL1. If these scattered lights pass through the opening PD of the detection aperture stop 26 to enter the image sensor 25, they are detected by the image sensor 25. This superimposes noise components on the image of the moiré fringe. With respect to the pole IL3 as well, specular reflected lights by the mold mark 10 and the substrate mark 11 are blocked by the detection aperture stop 26. However, the illumination light emitted to the pattern edge parallel to the Y direction is scattered in the X direction by the pattern edge to generate first-order reflected light N3(1) and second-order reflected light N3(2) with reference to specular reflected light N3(0) of the illumination light from the pole IL3. Thus, an image is formed on the imaging surface of the image sensor 25 from the scattered lights from the four side portions of the pattern edges, and is superimposed on an image captured by the image sensor 25.

Practical examples of influence on detection of the moiré fringe are as follows. If light from an edge parallel to the Y direction is superimposed on an image of the moiré fringe whose measurement direction is the X direction, the light increases the light amount in a portion close to the edge of the image of the moiré fringe, the light amount of the moiré fringe can change laterally asymmetrically. Therefore, an error can be generated when detecting the position of the image of the moiré fringe. Alternatively, if light from an edge parallel to the X direction is superimposed on the moiré fringe whose measurement direction is the X direction, the light applies a bias to the image of the moiré fringe. Thus, contrast decreases when detecting the moiré fringe, thereby degrading detection reproducibility. Therefore, the detection performance is improved by blocking the light from the pattern edge by the pupil surface Pdet of the detection system 21.

Figure 1A:
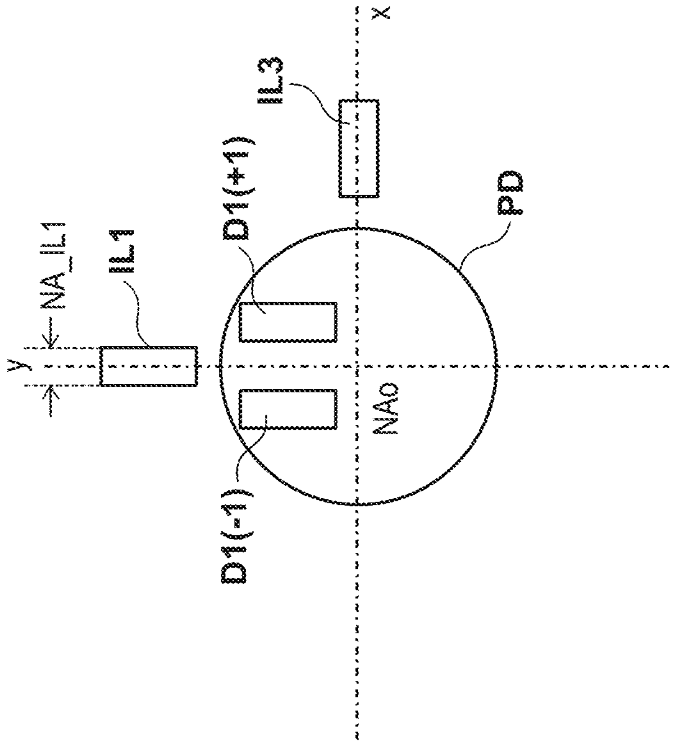
FIG. 1A is a view showing the light intensity distribution of light entering a pupil surface of a detection system and a light intensity distribution at the exit of a pupil surface of an illumination system according to the first embodiment.

FIG. 1A shows the light intensity distribution of light entering the pupil surface Pdet of the detection system 21 and the light intensity distribution at the exit of the pupil surface Pill of the illumination system 22 by superimposing them on each other according to the first embodiment. The light intensity distribution at the exit of the pupil surface Pill of the illumination system 22 includes the poles IL1 and IL3. The pole IL1 is arranged on the y-axis, and the pole IL3 is arranged on the x-axis. When the mold mark 10 and the substrate mark 11 are illuminated with the illumination light from the pole IL1, diffracted lights D1(+1) and D1(−1) are generated. The diffracted lights D1(+1) and D1(−1) pass through the opening PD of the pupil surface Pdet of the detection system 21 to enter the imaging surface of the image sensor 25. The diffracted lights D1(+1) and D1(−1) form an optical image of a moiré fringe on the imaging surface of the image sensor 25. In this example, a combination of the mold mark 10 and the substrate mark 11 can be a combination of the checkerboard diffraction grating pattern and the first-order diffraction grating pattern respectively shown in FIGS. 6A and 6B. The diffracted lights of the illumination light illuminating the marks 10 and 11 are diffracted in the X direction and the Y direction. For example, P1 and P3 respectively represent pitches in the X and Y directions of the diffraction grating pattern shown in FIG. 6A and P2 represents a pitch in the X direction in FIG. 6B. For the sake of the descriptive convenience, P1>P2 is set. However, those skilled in the art can understand that even if the magnitude relationship is reversed, diffracted lights can be obtained. In this example, the first-order diffraction grating pattern is used for the mold mark 10 and the checkerboard diffraction grating pattern is used for the substrate mark 11 and vice versa. A diffraction angle θ (an angle with respect to a direction parallel to the optical axis) of the first-order diffracted light can generally be represented, as follows.

$$\theta x1=\arcsin(\lambda/P1),\ \theta x2=\arcsin(\lambda/P2)$$

where λ represents the wavelength of the illumination light. Diffracted lights from the diffraction gratings are generated in the positive and negative directions. Therefore, light diffracted by the mold mark 10 and the substrate mark 11 that form a moiré fringe is diffracted with four diffraction angles (θx1+θx2, θx1−θx2, −θx1+θx2, and −θx1−θx2) in the X direction. If the diffracted lights with diffraction angles of θx1+θx2 and −θx1−θx2 are used, it is necessary to increase the NA of the detection system 21 and the period of the interference fringe becomes small. Therefore, even if detection is performed, the detection accuracy cannot be improved. Thus, the diffracted lights with small diffraction angles of θx1−θx2 and −θx1+θx2 are detected. The angle in the X direction with respect to the optical axis of the diffracted light can be represented by −θx1+θx2 in the case of the diffracted light D1(+1) shown in FIG. 1A, and can be represented by θx1−θx2 in the case of diffracted light D2(−1) shown in FIG. 1A. At the position of the detection aperture stop 26 of the detection system 21 shown in FIG. 1A, a coordinate in the X-direction can be represented by f×tan(−θx1+θx2) for the diffracted light D1(+1) and f×tan (θx1−θx2) for the diffracted light D1(−1) where f represents the focal length of a lens group arranged between the diffraction grating (alignment mark) and the detection aperture stop 26 of the detection system 21.

Next, light diffracted in the Y direction with respect to the optical axis will be described. Since the checkerboard diffraction grating shown in FIG. 6A also has a period in the Y direction, diffracted light from the diffraction grating shown in FIG. 6A is diffracted in the X direction and the Y direction. Since the pitch in the Y direction is P3, the diffraction angle of the diffracted light can be given by:

$$\theta y=\arcsin(\lambda/P3)$$

Referring to FIG. 1A, the specular reflected light of the illumination light from the pole IL1 is reflected at a position symmetrical to the illumination light with the X-axis as the axis of symmetry in the Y direction. That is, if an incident angle to the X-Y plane of the illumination light from the pole IL1 is represented by θILy, the position of the illumination light on the detection aperture stop 26 (pupil surface Pdet) is represented by f×tan(θILy). The position of the specular reflected light of the illumination light is represented by f×tan(−θILy). The first-order diffracted light from the checkerboard diffraction grating is diffracted at the angle θy with respect to the specular reflected light. That is, in FIG. 1A, the position in the Y direction of the diffracted light on the pupil surface Pdet is obtained by adding f×tan(θy) as a shift amount corresponding to the angle θy of the diffracted light to the specular reflected light (f×tan(−θILy)) of the illumination light from the pole IL1. By adjusting the pitch P3 in the Y direction, the light can be diffracted at the positions of the diffracted lights D1(+1) and D1(−1) shown in FIG. 1A. An interference fringe (moiré fringe) whose intensity changes in the X direction is formed on the imaging surface of the image sensor 25 by the diffracted lights D1(+1) and D1(−1), and is detected by the image sensor 25.

The pole IL3 is obtained by rotating the pole IL1 clockwise by 90°. Diffracted lights are generated by illuminating the diffraction gratings shown in FIGS. 6C and 6D, thereby making it possible to form a moiré fringe whose intensity changes in the Y direction. The moiré fringes in the X direction and the Y direction may have the same pitch or may have different pitches in consideration of the region of the pattern where a mark is arranged. In the example shown in FIG. 1A, the light intensity distribution formed at the exist of the pupil surface Pill of the illumination system 22 is formed by the poles IL1 and IL3 and is an asymmetrical light intensity distribution with respect to the optical axis.

FIG. 1B shows an example of the detection aperture stop 26 arranged on the pupil surface Pdet of the detection system 21. A white portion is an opening and a black portion is a light blocking body. As described above with reference to FIG. 8, the scattered lights from the pattern edges are distributed on the x-axis and y-axis of the detection aperture stop 26 (pupil surface Pdet). To block the unnecessary scattered light, a light blocking body BP including light blocking portions for blocking light on the x-axis and the y-axis of the detection aperture stop 26 is arranged. This can block the scattered light from the pattern edge. The light blocking body BP can include a first light blocking portion BP1 crossing the optical axis of the detection system 21 in a direction (third direction) parallel to the x-axis, and a second light blocking portion BP2 crossing the optical axis of the detection system 21 in a direction (fourth direction) parallel to the y-axis. The first light blocking portion BP1 can be arranged to extend over the diameter in the x direction of the pupil surface Pdet of the detection system 21. The second light blocking portion BP2 can be arranged to extend over the diameter in the y direction of the pupil surface Pdet of the detection system 21.

In this example, the x direction (third direction) parallel to the x-axis is a direction conjugate to the X direction (first direction) parallel to the X-axis, and the y direction (fourth direction) parallel to the y-axis is a direction conjugate to the Y direction (second direction) parallel to the Y-axis. In the detection system 21, if the x direction and the X direction are conjugate to each other, this means that the x direction and the X direction coincide with each other in a case where there is no reflective surface that bends the optical axis of the detection system 21 between the mold 7/substrate 8 and the pupil surface Pdet of the detection system 21. In the detection system 21, if the x direction and the X direction are conjugate to each other, this means that the X direction mapped on the pupil surface Pdet by the reflective surface coincides with the x direction in a case where there exists the reflective surface that bends the optical axis between the mold 7/substrate 8 and the pupil surface Pdet of the detection system 21. In a case where there exists the reflective surface, the x direction may or may not coincide with the X direction. The same applies to conjugation of the y direction to the Y direction.

The above description is applied to the x direction and the y direction of the pupil surface Pill of the illumination system 22. That is, the x direction (fifth direction) parallel to the x-axis of the pupil surface Pill is a direction conjugate to the X direction (first direction) parallel to the X-axis, and the y direction (sixth direction) parallel to the y-axis of the pupil surface Pill is a direction conjugate to the Y direction (second direction) parallel to the Y-axis. In the illumination system 22, if the x direction and the X direction are conjugate to each other, this means that the x direction and the X direction coincide with each other in a case where there is no reflective surface that bends the optical axis of the illumination system 22 between the mold 7/substrate 8 and the pupil surface Pill of the illumination system 22. In the illumination system 22, if the x direction and the X direction are conjugate to each other, this means that the X direction mapped on the pupil surface Pill by the reflective surface coincides with the x direction in a case where there exists the reflective surface that bends the optical axis between the mold 7/substrate 8 and the pupil surface Pill of the illumination system 22. In a case where there exists the reflective surface, the x direction may or may not coincide with the X direction. The same applies to conjugation of the y direction to the Y direction.

A width (a width in the y direction) NAbp1 of the first light blocking portion BP1 is preferably equal to or larger than a width (a width in the x direction) NA_IL1 of the pole ILL. That is, NAbp1≥NA_IL1 is desirable. This can block, by the first light blocking portion BP1, the scattered light of the illumination light from any position in the pole 1. That is, of the lights from the mold mark 10 (diffraction grating) and the substrate mark 11 (diffraction grating) illuminated with the illumination light, unnecessary light including no optical information representing the relative position between the marks can be blocked by the first light blocking portion BP1 and the second light blocking portion BP2.

The pupil surface Pdet of the detection system 21 includes a light transmitting region AP in a region where no light blocking body BP is arranged. The diffracted lights from the mold mark 10 (diffraction grating) and the substrate mark 11 (diffraction grating) illuminated with the illumination light preferably pass through the light transmitting region AP, thereby forming optical information representing the relative position between the mold 7 and the substrate 8 on the imaging surface of the image sensor 25.

More specifically, the diffracted lights D1(+1) and D1(−1) that form a moiré fringe on the imaging surface of the image sensor 25 preferably pass the light transmitting region AP. Thus, the light blocking body BP, the mold mark 10 (diffraction grating), and the substrate mark 11 (diffraction grating) can be designed so the diffracted lights D1(+1) and D1(−1) do not enter the light blocking body BP. For the sake of simplicity, consider a case where the diffracted lights D1(+1) and D1(−1) have no widths.

On the pupil surface Pdet of the detection system 21, the positions of the diffracted lights D1(+1) and D1(−1) are represented by f×tan(−θ×1+θ×2) and f×tan(θ×1−θ×2), respectively. That is, with respect to the x direction, the light blocking body BP, the mold mark 10 (diffraction grating), and the substrate mark 11 (diffraction grating) can be designed so that the diffracted lights D1(+1) and D1(−1) pass through the light transmitting region AP.

$$|f\times\tan(-\theta\times 1+\theta\times 2)|\geq NAbp1/2 \quad (1)$$

With respect to the y direction, the light blocking body BP, the mold mark 10 (diffraction grating), and the substrate mark 11 (diffraction grating) can be designed so as to satisfy:

$$|f\times\tan(-\theta ILy)+f\times\tan(\theta y)|\geq NAbp3/2 \quad (2)$$

In this example, |f×tan(−θILy)+f×tan(θy)| has solutions for two positions on the negative and positive sides in the y direction. On the pupil surface Pdet of the detection system 21, if there exists the light transmitting region AP near (on the negative side in the y direction) the specular reflected light of the illumination light from the pole IL1, noise can be generated. Furthermore, as the pitch of the diffraction grating is smaller, the number of pitches of the diffraction grating falling within a predetermined area is larger. Thus, the spread of the angle distribution of the diffracted light is small. Therefore, |f×tan(−θILy)+f×tan(θy)| is desirably on the opposite side of the specular reflected light of the illumination light from the pole IL1, that is, on the positive side in the y direction.

With respect to the central beam of the illumination light, the diffracted lights that form a moiré fringe by satisfying expressions (1) and (2) are not blocked by the light blocking body BP and can be detected by the image sensor 25. However, the pole IL1 has the width NA_IL1, and the number of pitches of the diffraction grating is finite. By considering these, expressions (1) and (2) are extended to expressions (3) and (4).

$$|f \times \tan(-\theta x1+\theta x2)| \geq NAbp1/2+\text{width of diffracted light}/2 \quad (3)$$

$$|f \times \tan(-\theta IL y)+f \times \tan(\theta y)| \geq NAbp3/2+\text{width of diffracted light}/2 \quad (4)$$

By satisfying expressions (3) and (4), all the diffracted lights from the mold mark 10 (diffraction grating) and the substrate mark 11 (diffraction grating) illuminated with the illumination light pass through the light transmitting region AP to enter the imaging surface of the image sensor 25.

Figure 9A:
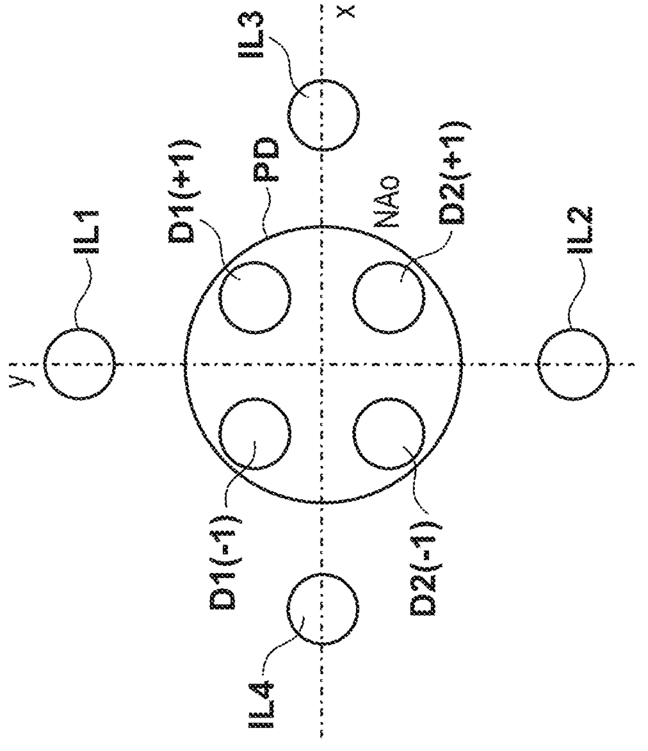
FIG. 9A is a view showing the light intensity distribution of light entering a pupil surface of a detection system and a light intensity distribution at the exit of a pupil surface of an illumination system according to the second embodiment.

FIG. 9A shows the light intensity distribution of light entering the pupil surface Pdet of the detection system 21 and the light intensity distribution at the exit of the pupil surface Pill of the illumination system 22 by superimposing them on each other according to a modification of the first embodiment. According to the modification, as shown in FIG. 9A, the light intensity distribution at the exit of the pupil surface Pill of the illumination system 22 includes the poles IL1, IL2, IL3, and IL4. The light intensity distribution including the poles IL1, IL2, IL3, and IL4 is a light intensity distribution symmetrical with respect to the optical axis. The pole IL1 and IL2 are located at two different points on the y-axis, and the pole IL3 and IL4 are located at two different points on the x-axis. The number of poles is not limited to four and may be another number (for example, eight).

Figure 9B:
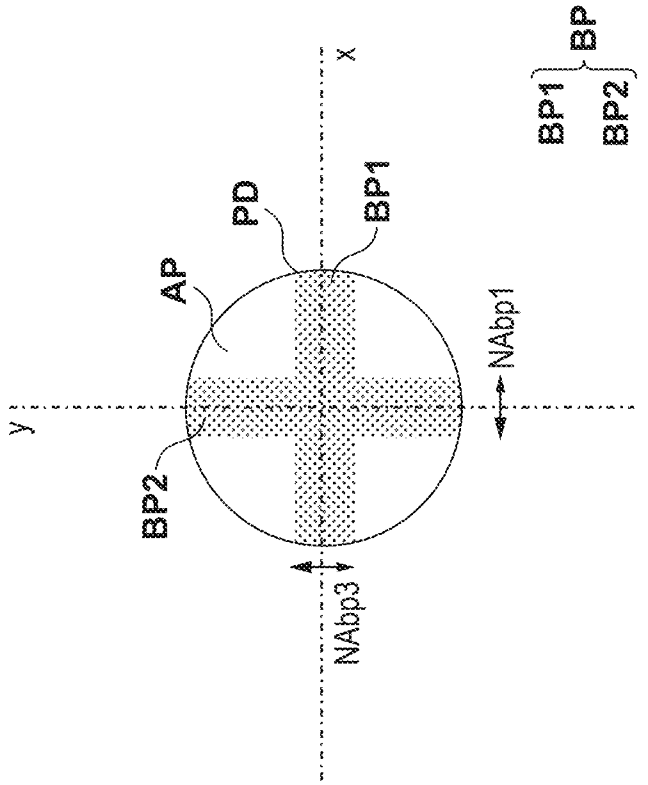
FIG. 9B is a view showing a light blocking body arranged on the pupil surface of the detection system according to the second embodiment.

FIG. 9B shows the shape of the detection aperture stop 26. A white portion is an opening and a black portion is a light blocking body. Similar to the light blocking body BP shown in FIG. 1B, the light blocking body BP shown in FIG. 9B includes the first light blocking portions BP1 and BP2, each of which blocks light, on the x-axis and the y-axis of the detection aperture stop 26, respectively. The light blocking body BP blocks scattered light from the pattern edge.

In the example of the arrangement shown in FIG. 1A, the positions of the poles IL1 and IL3 are not centrosymmetric with respect to the optical axis. Therefore, a detection error may be generated by a positional error of the imaging surface in the optical axis direction. On the other hand, if the poles IL1, IL2, IL3, and IL4 are arranged to be centrosymmetric with respect to the optical axis as in the example of the arrangement shown in FIG. 9A, a detection error can be made insensitive with respect to the positional error of the imaging surface in the optical axis direction.

The diffracted lights of the illumination lights from the poles IL1 and IL3 shown in FIG. 9A are the same as the diffracted lights of the illumination lights from the poles IL1 and IL3 shown in FIG. 1A. The poles IL1 and IL2 are located at positions symmetrical with respect to the x-axis. Lights that are diffracted by the mold mark 10 (diffraction grating) and the substrate mark 11 (diffraction grating) when irradiating the marks with the illumination light from the pole IL2 are represented by D2(+1) and D2(−1). Since the poles IL1 and IL2 are located at the positions symmetrical with respect to the x-axis, the diffracted lights D1(+1) and D1(−1) and the diffracted lights D2(+1) and D2(−1) enter at positions symmetrical with respect to the x-axis of the pupil surface Pdet of the detection system 21. The diffracted lights D1(+1), D1(−1), D2(+1), and D2(−1) form a moiré fringe whose intensity changes in the X direction.

The poles IL3 and IL4 are obtained by rotating the poles IL1 and IL2 clockwise by 90°. The diffraction gratings for Y-direction measurement illuminated with the illumination lights from the poles IL3 and IL4 generate diffracted lights D3(+1), D3(−1), D4(+1), and D4(−1) (not shown). The diffracted lights D3(+1), D3(−1), D4(+1), and D4(−1) are diffracted at positions obtained by rotating the diffracted lights D1(+1), D1(−1), D2(+1), and D2(−1) about the optical axis by 90°. The diffracted lights D3(+1), D3(−1), D4(+1), and D4(−1) form a moiré fringe whose intensity changes in the y direction.

Figure 10:
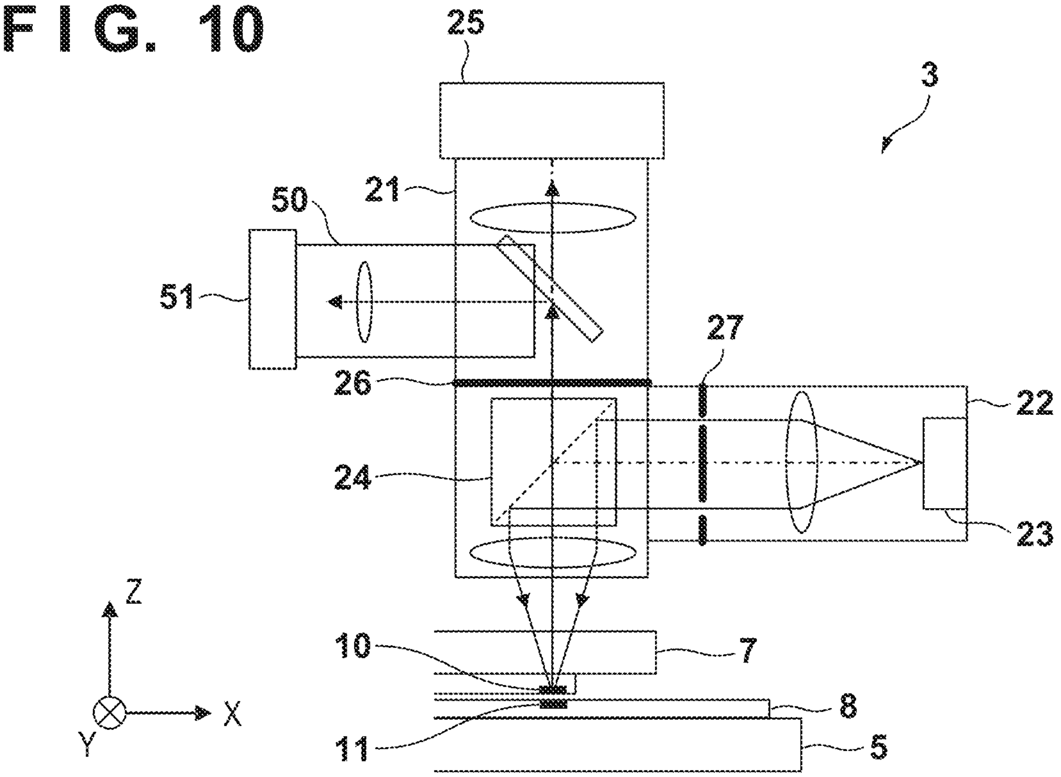
FIG. 10 is a view exemplifying the arrangement of a detection device according to the second embodiment.

A detection device 3 according to the second embodiment will be described below with reference to FIG. 10. Note that matters not mentioned in the second embodiment can comply with the first embodiment. FIG. 10 shows the arrangement of the detection device 3 according to the second embodiment. The detection device 3 according to the second embodiment includes a first detection system 21 and a second detection system 50. The first detection system 21 and the second detection system 50 can share some components. Furthermore, the first detection system 21, the second detection system 50, and an illumination system 22 can share some components. The first detection system 21 includes a first image sensor 25, and the second detection system 50 includes a second image sensor 51. As described in detail in the first embodiment, the first detection system 21 is configured to detect a moiré fringe formed by diffraction gratings as fine-detection marks. The second detection system 50 is configured to detect a pitch shift, that is, rough-detection marks.

The illumination system 22 and the first detection system 21 can be formed, similar to the first embodiment. This can detect, with high accuracy, a moiré fringe formed by diffraction gratings exemplified in FIGS. 6A to 6D. To detect rough-detection marks by the second detection system 50, the illumination system 22 advantageously performs, for example, quadrupole illumination exemplified in FIG. 9A.

To detect a moiré fringe with high accuracy, it is desirable to set a high imaging magnification from a mold mark 10/substrate mark 11 to the image sensor 25. On the other hand, since the second detection system 50 that detects rough-detection marks suffices to measure a pitch shift between diffraction gratings, even if the imaging magnification from the mold mark 10/substrate mark 11 to the image sensor 51 is set low, the influence on accuracy is small. By setting a low imaging magnification from the mold mark 10/substrate mark 11 to the image sensor 51, the measurement field of view can be increased. Therefore, even if there is a large positional shift between the positions of a mold 7 and a substrate 8, it is possible to observe a wide range, and thus it is possible to measure the positions without searching. As described above, in the second embodiment, by providing the first detection system 21 and the second detection system 50 by branching an optical path, the magnification of the first detection system 21 and that of the second detection system 50 can be made different from each other.

Figure 11:
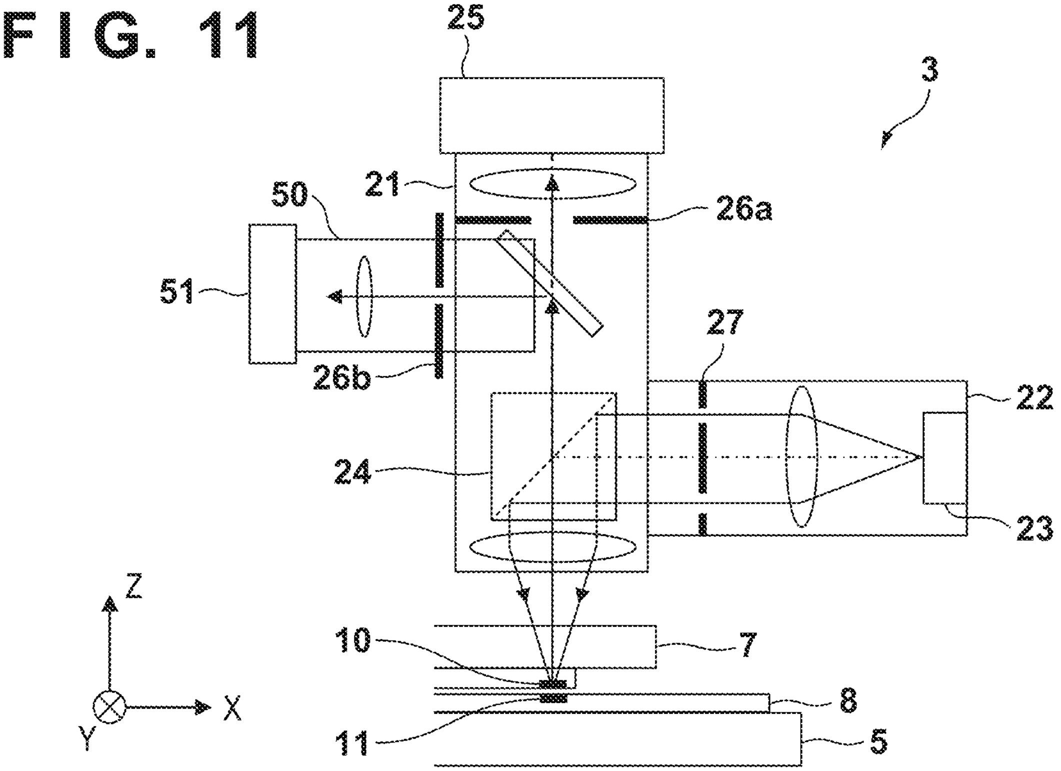
FIG. 11 is a view exemplifying the arrangement of a detection device according to a modification of the second embodiment.

As a modification, after branching the optical path of the first detection system 21 and that of the second detection system 50, a detection aperture stop may be arranged. This can decrease light as noise. As exemplified in FIG. 11, it is possible to arrange a first detection aperture stop 26*a* on an optical path between the mold mark 10/substrate mark 11 and the image sensor 25. In addition, it is possible to arrange a second detection aperture stop 26*b* on an optical path between the mold mark 10/substrate mark 11 and the image sensor 51. The first detection aperture stop 26*a* and the second detection aperture stop 26*b* can have different shapes or characteristics.

In this modification, the first detection system 21 may detect a moiré fringe whose intensity changes in the X direction, and the second detection system 50 may detect a moiré fringe whose intensity changes in the Y direction. In this case, it is preferable to refine and adopt the detection aperture stop shown in FIG. 1*i*. In the detection aperture stop shown in FIG. 1B, there are an opening for detecting a moiré fringe, whose intensity changes in the X direction, only on the positive side in the y direction, and an opening for detecting a moiré fringe, whose intensity changes in the X direction, only on the positive side in the x direction. Thus, with respect to the detection aperture stop 26*a* for detecting a moiré fringe whose intensity changes in the X direction, a portion on the negative side in the y direction in FIG. 1B is a light blocking portion. With respect to the detection aperture stop 26*b* for detecting a moiré fringe whose intensity changes in the Y direction, a portion on the negative side in the x direction in FIG. 1B is a light blocking portion. This can reduce light as noise. Note that the shape of the detection aperture stop is not limited to them.

Figure 12:
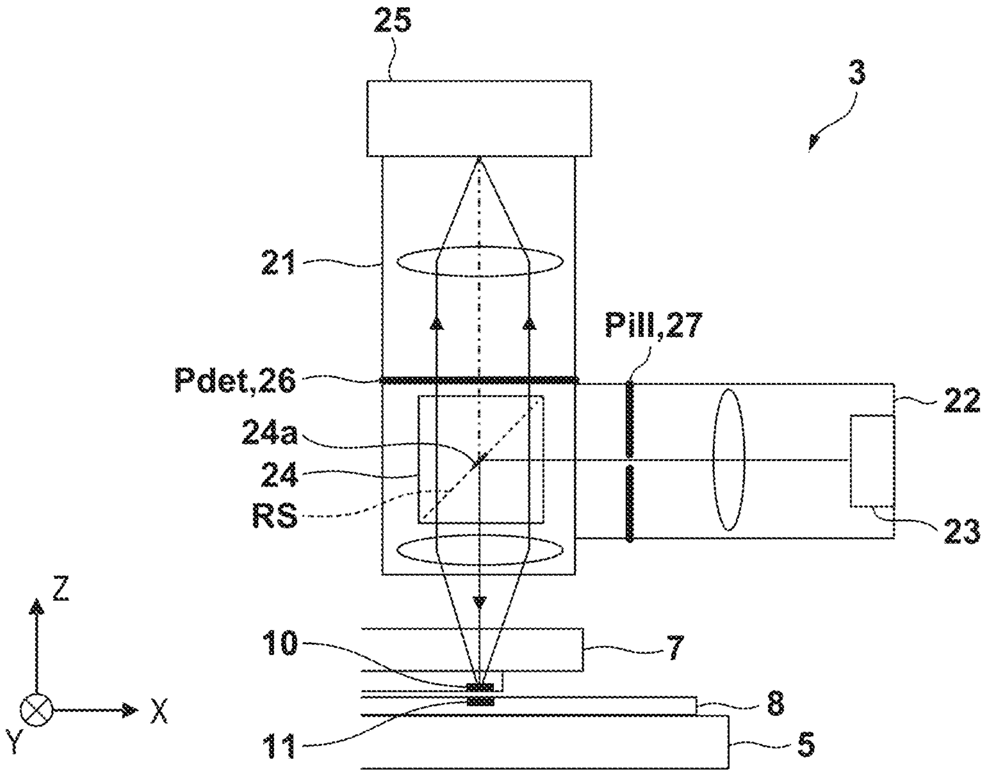
FIG. 12 is a view exemplifying the arrangement of a detection device according to the third embodiment.

A detection device 3 according to the third embodiment will be described below with reference to FIG. 12. Note that matters not mentioned in the third embodiment can comply with the first or second embodiment. In the third embodiment, an illumination aperture stop 27 arranged on a pupil surface Pill of an illumination system 22 is a pinhole plate including a pinhole. Thus, illumination light is formed by light beams passing through or near the optical axis of the illumination system 22 on the pupil surface Pill of the illumination system 22. A reflective film 24*a* can be configured to reflect the light beams to illuminate a mold mark 10/substrate mark 11. Note that the illumination aperture stop 27 may be an arbitrary component, and may form illumination light parallel to an optical axis by defining the region of the reflective film 24*a*. A detection aperture stop 26 arranged on a pupil surface Pdet of a detection system 21 can comply with the first or second embodiment.

An article manufacturing method using an imprint apparatus represented by the above-described embodiment will be described next. The article can be, for example, a semiconductor device, a display device, a MEMS, or the like. The article manufacturing method can include a transfer step of transferring a pattern of an original to a substrate using a lithography apparatus or an imprint apparatus, and a processing step of processing the substrate so as to obtain an article from the substrate having undergone the transfer step. The transfer step can include a contact step of bringing the mold 7 and the imprint material 9 on the shot region of the substrate 8 into contact with each other. The transfer step can also include a measurement step of measuring the relative position between the mold 7 and the shot region (or the substrate mark) of the substrate 8. The transfer step can also include an alignment step of aligning the mold 7 and the shot region of the substrate 8 based on the result of the measurement step. The transfer step can also include a curing step of curing the imprint material 9 on the substrate 8 and a separation step of separating the imprint material 9 from the mold 7. This forms or transfers the pattern made of a cured product of the imprint material 9 on the substrate 8. The processing step can include, for example, etching, resist peeling, dicing, bonding, and packaging.

The pattern made of the cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 13A:
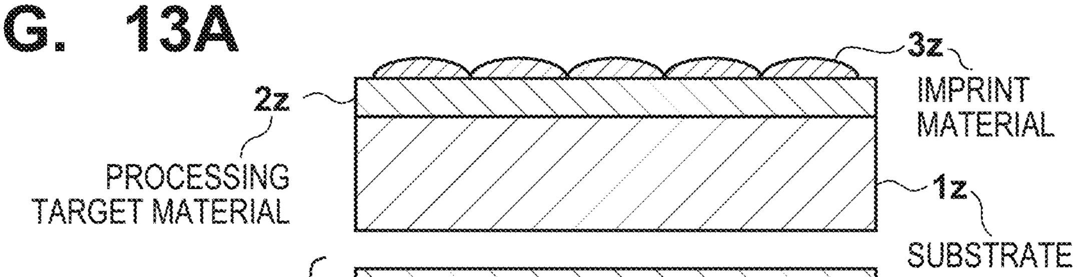
FIGS. 13A to 13F are views exemplifying an article manufacturing method.

An article manufacturing method in which an imprint apparatus forms a pattern on a substrate, processes the substrate on which the pattern has been formed, and manufactures an article from the processed substrate will be described next. As shown FIG. 13A, a substrate 1*z* such as a silicon wafer with a processed material 2*z* such as an insulator formed on the surface is prepared. Next, an imprint material 3*z* is applied to the surface of the processed material 2*z* by an inkjet method or the like. A state in which the imprint material 3*z* is applied as a plurality of droplets onto the substrate is shown here.

Figure 13B:
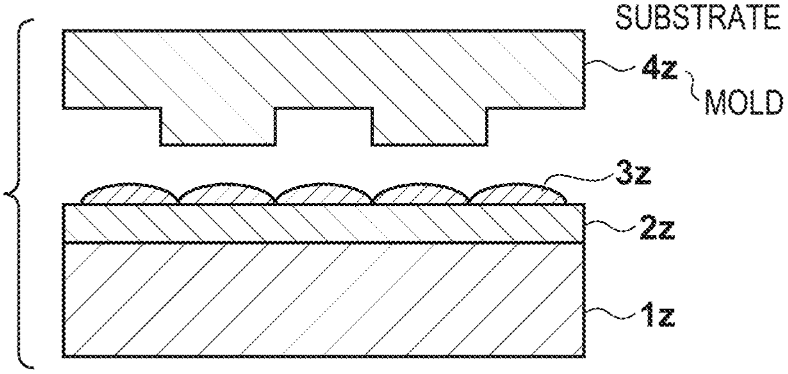
Figure 13C:
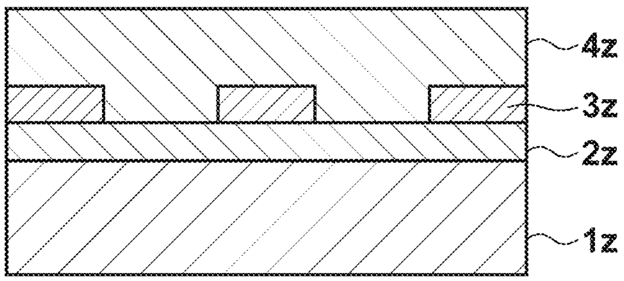

As shown in FIG. 13B, a side of a mold 4*z* for imprint with a concave-convex pattern is directed to face the imprint material 3*z* on the substrate. As shown FIG. 13C, the substrate 1*z* to which the imprint material 3*z* has been applied is brought into contact with the mold 4*z*, and a pressure is applied. The gap between the mold 4*z* and the processed material 2*z* is filled with the imprint material 3*z*. In this state, when the imprint material 3*z* is irradiated with light as curing energy via the mold 4*z*, the imprint material 3*z* is cured.

Figure 13D:
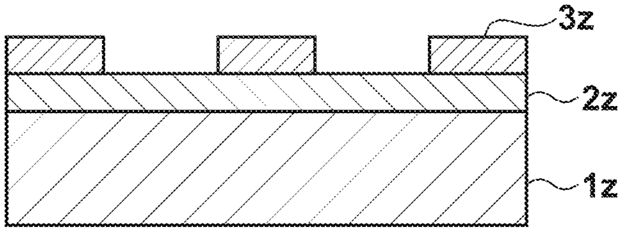

As shown in FIG. 13D, after the imprint material 3*z* is cured, the mold 4*z* is separated from the substrate 1*z*, and the pattern of the cured product of the imprint material 3*z* is formed on the substrate 1*z*. In the pattern of the cured product, the concave portion of the mold corresponds to the convex portion of the cured product, and the convex portion of the mold corresponds to the concave portion of the cured product. That is, the concave-convex pattern of the mold 4*z* is transferred to the imprint material 3*z*.

Figure 13E:
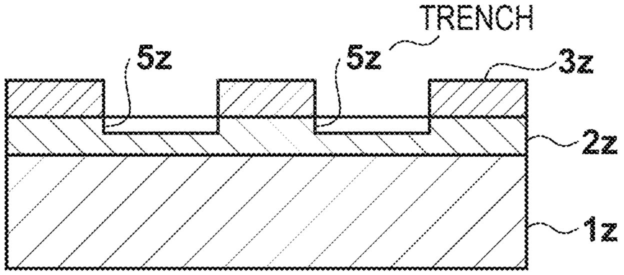
Figure 13F:
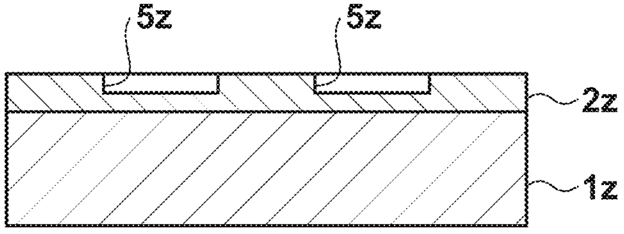

As shown in FIG. 13E, when etching is performed using the pattern of the cured product as an etching resistant mask, a portion of the surface of the processed material 2*z* where the cured product does not exist or remains thin is removed to form a groove 5*z*. As shown in FIG. 13F, when the pattern of the cured product is removed, an article with the grooves 5*z* formed in the surface of the processed material 2*z* can be obtained. Here, the pattern of the cured product is removed. However, instead of removing the pattern of the cured product after the process, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-116574, filed Jul. 21, 2022, which is hereby incorporated by reference herein in its entirety.

What is claimed is:

1. A detection device for detecting a relative position between a first mark provided in a first object and a second mark provided in a second object within a measurement field of view of a detection system, the detection device comprising:

an illumination system configured to illuminate the first mark and the second mark with illumination light, which is unpolarized light;

the detection system, which includes an image sensor and a pupil surface, configured to form an image on an imaging surface of the image sensor from diffracted lights from the first mark and the second mark illuminated by the illumination system, wherein the first mark and the second mark are configured to form, on the imaging surface, optical information representing the relative position in a first direction or a second direction orthogonal to the first direction; and a light blocking body provided on the pupil surface of the detection system, the light blocking body including:

a first light blocking portion crossing an optical axis of the detection system in a third direction, which is a direction conjugate to the first direction; and a second light blocking portion crossing the optical axis of the detection system in to a fourth direction, which is a direction conjugate to the second direction, wherein the pupil surface of the detection system includes, in regions where the light blocking body is not arranged, a plurality of light transmitting regions, and wherein the diffracted lights from the first mark and the second mark that form the optical information pass through at least two of the plurality of light transmitting regions to enter the imaging surface.

2. The device according to claim 1, wherein among lights from the first mark and the second mark illuminated with the illumination light, unnecessary light including no information representing the relative position is blocked by both the first light blocking portion and the second light blocking portion.

3. The device according to claim 1, wherein the illumination system is configured to perform, for the first mark and the second mark, oblique incident illumination with the illumination light.

4. The device according to claim 3, wherein:

the illumination system includes a pupil surface, and a light intensity distribution at an exit of the pupil surface of the illumination system is asymmetrical with respect to an optical axis of the illumination system.

5. The device according to claim 3, wherein;

the illumination system includes a pupil surface, and a light intensity distribution at an exit of the pupil surface of the illumination system is symmetrical with respect to an optical axis of the illumination system.

6. The device according to claim 1, further comprising:

a prism that is shared by the illumination system and the detection system, and wherein the illumination system includes a pupil surface arranged between a light source and the prism, and wherein the illumination light is reflected by the prism to illuminate the first mark and the second mark.

7. The device according to claim 6, wherein:

the diffracted lights from the first mark and the second mark pass through the prism to enter the imaging surface, and the pupil surface of the detection system is arranged between the prism and the imaging surface.

8. The device according to claim 1, wherein:

the first light blocking portion extends over a diameter in the third direction of the pupil surface of the detection system, and the second light blocking portion extends over a diameter in the fourth direction of the pupil surface of the detection system.

9. The device according to claim 1, wherein first-order diffracted lights from the first mark and the second mark illuminated with the illumination light pass through the light transmitting region to form the optical information representing the relative position on the imaging surface.

10. The device according to claim 1, further comprising:

another detection system including another image sensor including another imaging surface, wherein a third mark is further provided in the first object and a fourth mark is further provided in the second object, and wherein the another detection system forms an image on the another imaging surface of the another image sensor from lights from the third mark and the fourth mark illuminated by the illumination system.

11. The device according to claim 10, wherein the detection system and the another detection system share some components.

12. The device according to claim 10, wherein a magnification of the detection system is different from a magnification of the another detection system.

13. The device according to claim 10, wherein further comprising:

a first aperture stop arranged on the pupil surface of the detection system; and a second aperture stop arranged on a pupil surface of the another detection system.

14. The device according to claim 1, wherein the illumination system is configured to change a wavelength of the illumination light.

15. A lithography apparatus for transferring a pattern of an original to a substrate, the lithography apparatus comprising:

the detection device according to claim 1, wherein the lithography apparatus is configured to align the original as the first object provided with the first mark and the substrate as the second object provided with the second mark based on an output from the detection device.

16. The apparatus according to claim 15, wherein the lithography apparatus is formed as an imprint apparatus.

17. An article manufacturing method comprising:

transferring the pattern of the original to the substrate using the lithography apparatus according to claim 16; and processing the substrate to obtain an article from the substrate having undergone the transferring.

* * * * *